(12) United States Patent
Song et al.

(10) Patent No.: US 12,495,637 B2
(45) Date of Patent: Dec. 9, 2025

(54) JIG FOR LAMINATING SOLAR CELL MODULE

(71) Applicant: HANWHA SOLUTIONS CORPORATION, Seoul (KR)

(72) Inventors: Kwang Young Song, Eumseong-gun (KR); Ju Hyun Ra, Eumseong-gun (KR)

(73) Assignee: HANWHA SOLUTIONS CORPORATION, Seoul (KR)

( * ) Notice: Subject to any disclaimer, the term of this patent is extended or adjusted under 35 U.S.C. 154(b) by 332 days.

(21) Appl. No.: 18/254,192

(22) PCT Filed: Nov. 26, 2021

(86) PCT No.: PCT/KR2021/017611
§ 371 (c)(1),
(2) Date: May 24, 2023

(87) PCT Pub. No.: WO2022/119244
PCT Pub. Date: Jun. 9, 2022

(65) Prior Publication Data
US 2023/0411550 A1 Dec. 21, 2023

(30) Foreign Application Priority Data
Dec. 3, 2020 (KR) .......................... 10-2020-0167123

(51) Int. Cl.
*H10F 71/00* (2025.01)
(52) U.S. Cl.
CPC .................................. *H10F 71/00* (2025.01)

(58) Field of Classification Search
CPC ...... H10F 19/90; H10F 19/902; H10F 19/904; G01B 5/00; G01B 3/566
(Continued)

(56) References Cited

U.S. PATENT DOCUMENTS 1,040,239 A * 10/1912 Rarey ...................... G01B 3/56
33/456
1,050,969 A * 1/1913 McLeod .................. B25H 7/04
33/420
(Continued)

FOREIGN PATENT DOCUMENTS

JP 2012151423 A 8/2012
KR 20110021468 A 3/2011
(Continued)

*Primary Examiner* — Jason L Vaughan
(74) *Attorney, Agent, or Firm* — Harvest IP Law, LLP

(57) ABSTRACT

The present disclosure may provide a jig for laminating a solar cell module, the jig including: a first body including a first upper surface and a first side surface adjacent to the first upper surface and having at least a partial area configured to come in contact with one side surface forming a corner of the solar cell module; a second body including a second upper surface and a second side surface adjacent to the second upper surface and having at least a partial area configured to come in contact with another side surface forming the corner; and a fixer disposed in a first groove of the first upper surface and a second groove of the second upper surface and disposed across the first body and the second body to fix the solar cell module, wherein the first upper surface and the second upper surface are positioned to be coplanar, and a thickness of the fixer is less than a thickness of the first groove and a thickness of the second groove.

10 Claims, 14 Drawing Sheets

(58) Field of Classification Search
USPC .......... 269/289 R, 41, 42; 403/201, DIG. 15
See application file for complete search history.

(56) References Cited

U.S. PATENT DOCUMENTS

| | | | | |
|---|---|---|---|---|
| 1,208,662 | A * | 12/1916 | Roth | G01B 3/56 |
| | | | | 33/419 |
| 1,618,862 | A * | 2/1927 | Collins | G01B 3/566 |
| | | | | 33/420 |
| 1,670,635 | A * | 5/1928 | Franz | G01B 3/06 |
| | | | | 33/423 |
| 1,916,638 | A * | 7/1933 | Rizianu | B43L 7/12 |
| | | | | 33/418 |
| 2,435,256 | A * | 2/1948 | Brody | B23B 47/28 |
| | | | | 408/116 |
| 2,517,264 | A * | 8/1950 | Name not available | |
| | | | | G01B 3/56 |
| | | | | 33/426 |
| 3,153,859 | A * | 10/1964 | Jones | E04G 21/1891 |
| | | | | 33/419 |
| 3,682,467 | A * | 8/1972 | Heinrich | B25B 5/142 |
| | | | | 269/41 |
| 4,058,902 | A * | 11/1977 | Hall | G01B 5/00 |
| | | | | 33/667 |
| 5,161,789 | A * | 11/1992 | Rogers | B25B 5/003 |
| | | | | 269/42 |
| 5,778,547 | A * | 7/1998 | Wolken | G01B 3/566 |
| | | | | 33/476 |
| 6,330,752 | B1 * | 12/2001 | Ellam | B25H 7/00 |
| | | | | 403/93 |
| 8,122,609 | B2 * | 2/2012 | Farr | E04F 21/0076 |
| | | | | 33/420 |
| 10,684,110 | B1 * | 6/2020 | Delgado | G01B 3/563 |
| 2003/0070310 | A1 * | 4/2003 | Werner | G01B 5/0014 |
| | | | | 33/474 |
| 2004/0231175 | A1 * | 11/2004 | Allemand | E04D 15/025 |
| | | | | 33/429 |
| 2012/0311880 | A1 * | 12/2012 | Doggett | B43L 7/0275 |
| | | | | 33/452 |
| 2013/0025142 | A1 * | 1/2013 | Holt | B43L 7/14 |
| | | | | 33/456 |
| 2013/0334397 | A1 | 12/2013 | Kashima | |
| 2020/0162017 | A1 | 5/2020 | Cassagne | |
| 2023/0070653 | A1 * | 3/2023 | Bahler | B43L 7/14 |

FOREIGN PATENT DOCUMENTS

| | | |
|---|---|---|
| KR | 20120100110 A | 9/2012 |
| WO | 2017067303 A1 | 4/2017 |

* cited by examiner

JIG FOR LAMINATING SOLAR CELL MODULE

CROSS-REFERENCE TO RELATED APPLICATION(S)

This application is a National Stage of International Application No. PCT/KR2021/017611 filed on Nov. 26, 2021, claiming priority based on Korean Patent Application No. 10-2020-0167123 filed on Dec. 3, 2020, the disclosure of which is incorporated herein by reference in its entirety.

TECHNICAL FIELD

The present disclosure relates to a jig for laminating a solar cell module.

BACKGROUND ART

Generally, a solar cell module is made of a form in which a front glass plate, an encapsulation material (e.g., an ethylene vinyl acetate (EVA) resin, etc.), a solar cell, an encapsulation material, and a resin-based back sheet are bonded, and power generation occurs at one side of the module. Meanwhile, a glass-to-glass type solar cell module has improved durability and allows both sides of the solar cell module to contribute to power generation. The glass-to-glass type solar cell module is made of a form in which a first glass plate, an encapsulation material, a solar cell, an encapsulation material, and a second glass plate are bonded.

A process of laminating a solar cell module is a process in which elements constituting the solar cell module are sequentially overlapped and then compressed using high-temperature heat and vacuum by a laminating device to fix the elements through an encapsulation material. In the laminating process, the solar cell module is pressed by a flat diaphragm sheet made of an elastic material such as silicone.

Here, there is concern that a problem may occur in which, due to an excessive pressure applied to corner portions of the solar cell module by the diaphragm sheet, the corner portions may be damaged, or a thickness of the corner portions may not be uniform with respect to other portions. In order to prevent such a problem, in the related art, a quadrangular frame formed to surround a solar cell module from four sides is used. That is, a solar cell module to be laminated is surrounded by a quadrangular frame and, in that state, added to a laminating device and pressed with a diaphragm sheet in order to be laminated. In this way, an excessive pressure from the diaphragm is mostly applied to the quadrangular frame instead of the corners of the solar cell module, thus addressing the above problem.

However, the related art has various problems. First, cost is required for manufacturing and managing the quadrangular frame. Also, there is a problem that, due to the quadrangular frame having a size larger than the size of the solar cell module, many workers are needed to mount the quadrangular frame on the solar cell module. Also, there is a problem that productivity is significantly reduced due to a task of placing the quadrangular frame around the solar cell module to be laminated and fixing the quadrangular frame with a tape and a task of removing the tape and removing the quadrangular frame after the laminating process, which are very cumbersome.

DISCLOSURE

Technical Problem

The present disclosure is directed to providing a jig for laminating a solar cell module that can enhance productivity while preventing damage to corners of a solar cell module due to a diaphragm sheet.

Objectives to be achieved by the present disclosure are not limited to the above-mentioned objective, and other objectives unmentioned herein should be clearly understood by those of ordinary skill in the art from the description below.

Technical Solution

One embodiment provides a jig for laminating a solar cell module, the jig including: a first body including a first upper surface and a first side surface adjacent to the first upper surface and having at least a partial area configured to come in contact with one side surface forming a corner of the solar cell module; a second body including a second upper surface and a second side surface adjacent to the second upper surface and having at least a partial area configured to come in contact with the other side surface forming the corner; and a fixer disposed in a first groove of the first upper surface and a second groove of the second upper surface and disposed across the first body and the second body to fix the solar cell module, wherein a length of the first body and a length of the second body are less than ½ of a length of the solar cell module.

The second body may be connected perpendicular to the first body.

The first side surface may include a plurality of first protrusions configured to come in contact with the one side surface forming the corner, the plurality of first protrusions may be disposed to be spaced apart in a longitudinal direction of the first body, the second side surface may include a plurality of second protrusions configured to come in contact with the other side surface forming the corner, and the plurality of second protrusions may be disposed to be spaced apart in a longitudinal direction of the second body.

The first body may include a first hole configured to communicate with the first side surface to form a path through which air in an encapsulation material of the solar cell module is released to an outside during a laminating process.

The first body may include a first lower surface and a third side surface adjacent to the first lower surface, and the first hole may be disposed to be concave in the first lower surface and be disposed to pass through the first side surface and the third side surface.

The second body may include a second hole configured to communicate with the second side surface to form a path through which air in an encapsulation material of the solar cell module is released to an outside during a laminating process.

The second body may include a second lower surface and a fourth side surface adjacent to the second lower surface, and the second hole may be disposed to be concave in the second lower surface and be disposed to pass through the second side surface and the fourth side surface.

The fixer may be disposed between the first protrusions neighboring each other in the longitudinal direction of the first body and may be disposed between the second protrusions neighboring each other in the longitudinal direction of the second body.

The first groove may be disposed between the first protrusions neighboring each other in the longitudinal direction of the first body, and the second groove may be disposed between the second protrusions neighboring each other in the longitudinal direction of the second body.

The first upper surface and the second upper surface may be positioned to be coplanar, and a thickness of the fixer may be less than a thickness of the first groove and a thickness of the second groove.

A surface of the first body and a surface of the second body may include a Teflon coating layer.

Advantageous Effects

According to an embodiment, by placing a jig only in the vicinity of corners of a solar cell module, there are advantages that the corners of the solar cell module can be protected from a pressing force of a diaphragm, the number of workers can be reduced, and the work can be simplified such that productivity is enhanced.

According to an embodiment, since the jig comes in contact only with portions adjacent to the corners of the solar cell module, there is an advantage that it is easy to remove the jig from the solar cell module.

According to an embodiment, since only a portion of the jig comes in contact only with the portions adjacent to the corners of the solar cell module, there is an advantage that removal of the jig after laminating is further facilitated.

MODES OF THE INVENTION

Objectives, specific advantages, and novel features of the present disclosure will become more apparent from the following detailed description and exemplary embodiments associated with the accompanying drawings. Also, terms or words used in the specification and the claims should not be interpreted as being limited to their general or dictionary meanings and should be interpreted to have meanings and concepts consistent with the technical spirit of the present disclosure, based on the principle that the inventor may appropriately define the concepts of terms in order to describe his or her invention in the best possible way. Also, in describing the present disclosure, detailed description of known related art that may unnecessarily obscure the gist of the present disclosure will be omitted.

Also, in describing elements of embodiments of the present disclosure, terms such as first, second, A, B, (a), and (b) may be used.

Such terms are only for distinguishing one element from another element, and the essence, sequence, order, or the like of the corresponding element is not limited by the terms.

Figure 1:
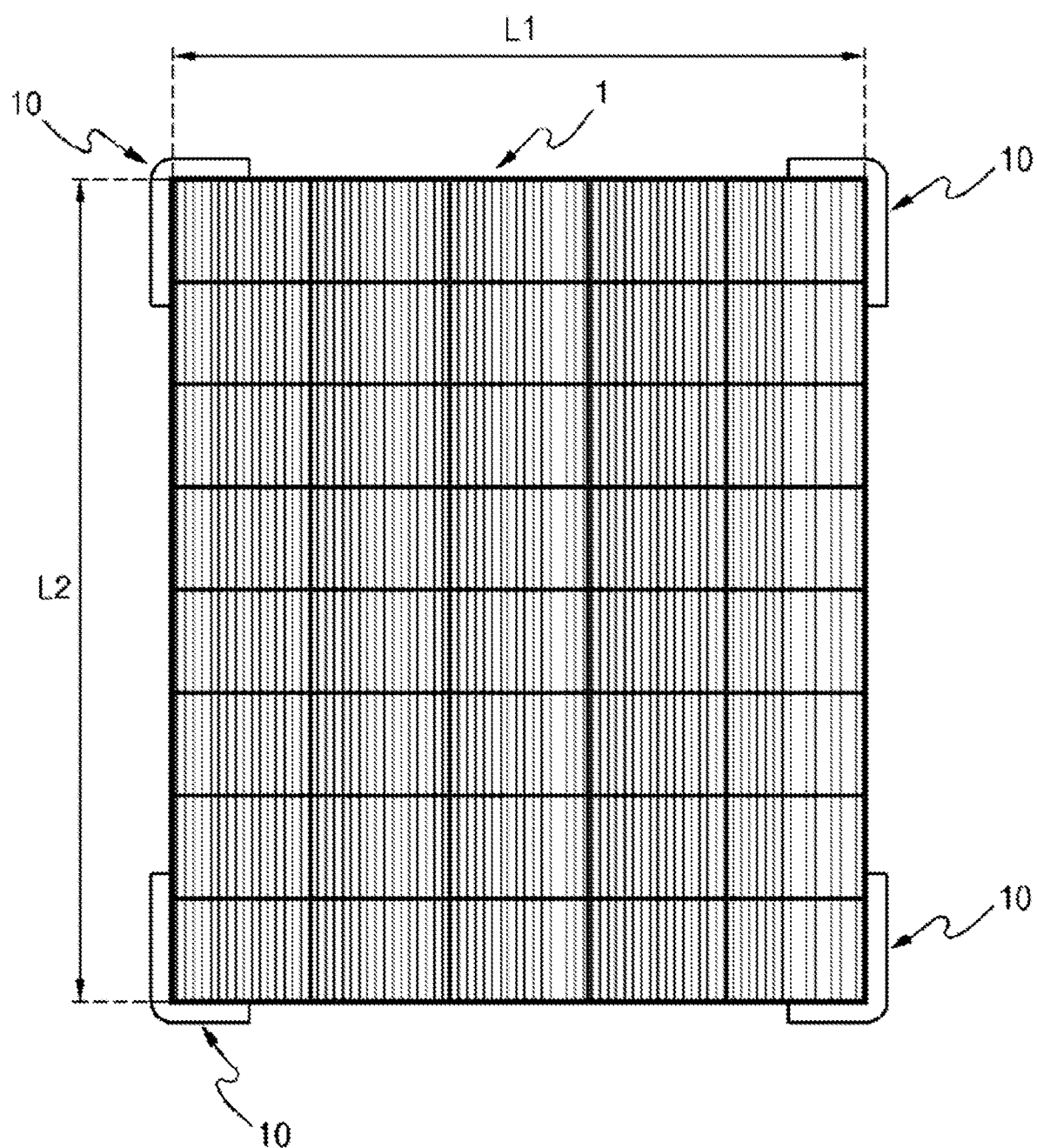
FIG. 1 is a view illustrating a state in which a jig according to an embodiment is mounted on a solar cell module.

FIG. 1 is a view illustrating a state in which a jig according to an embodiment is mounted on a solar cell module.

Referring to FIG. 1, a jig 10 according to an embodiment may be mounted on a corner of a solar cell module 1. The solar cell module 1 may have a rectangular shape in which a length L1 of one side surface forming a corner is longer than a length L2 of the other side surface forming the corner. The jig 10 may be mounted on each of four corners of the solar cell module 1. During a laminating process, the jig 10 receives pressure of a diaphragm sheet in place of the corners of the solar cell module 1 and prevents damage to the solar cell module 1. Here, the diaphragm sheet is a member configured to cover and press the solar cell module 1 in the laminating process. Also, in a state in which elements of the solar cell module 1 (for example, a front glass plate, an encapsulation material, a solar cell, an encapsulation material, and a back sheet, or a first glass plate, an encapsulation material, a solar cell, an encapsulation material, and a second glass plate) are overlapped before the laminating process, the encapsulation materials may be cross-linked and the elements may be integrally compressed through the laminating process to form the solar cell module 1.

Figure 2:
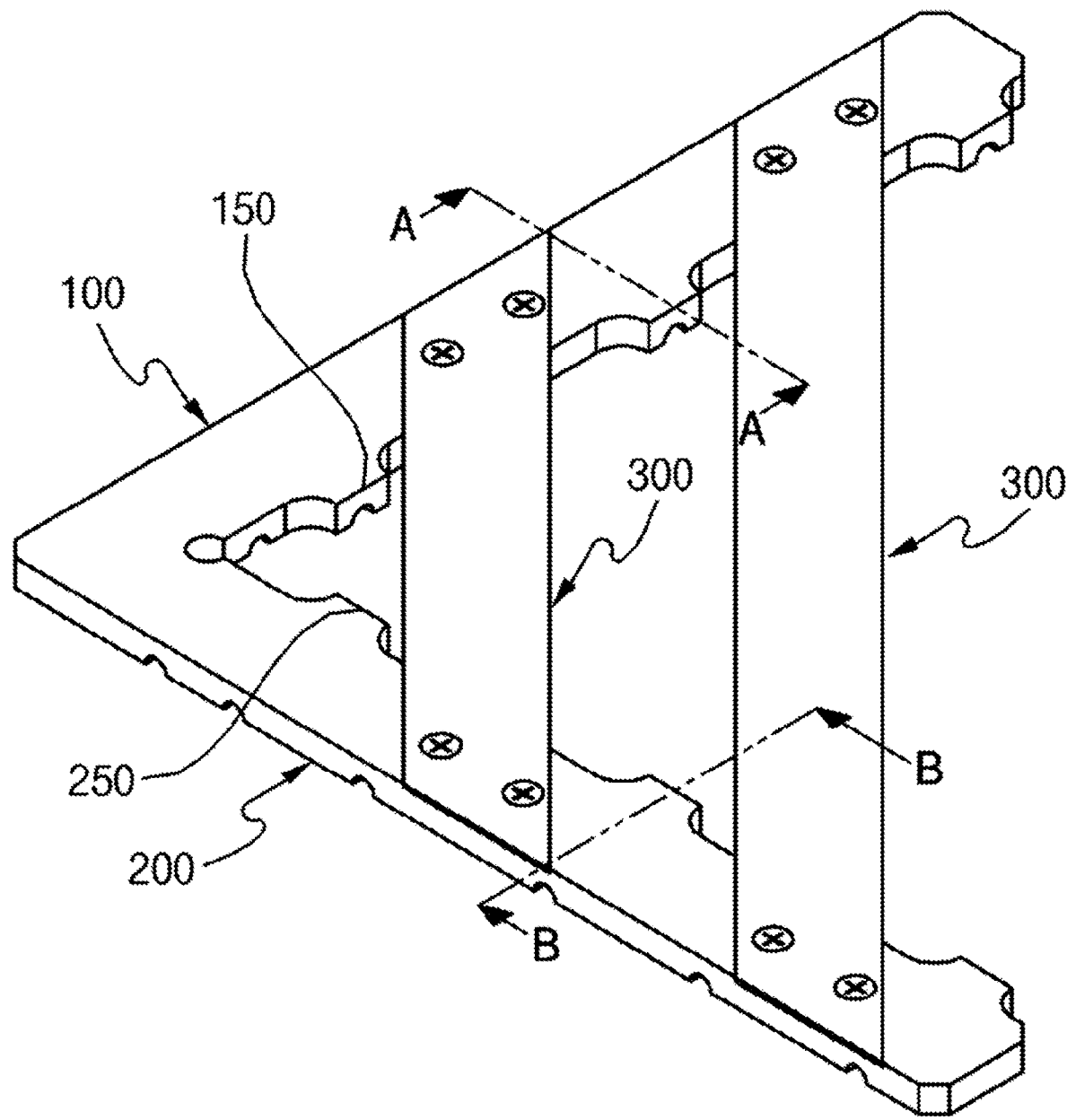
FIG. 2 is a perspective view of the jig illustrated in FIG. 1.
Figure 3:
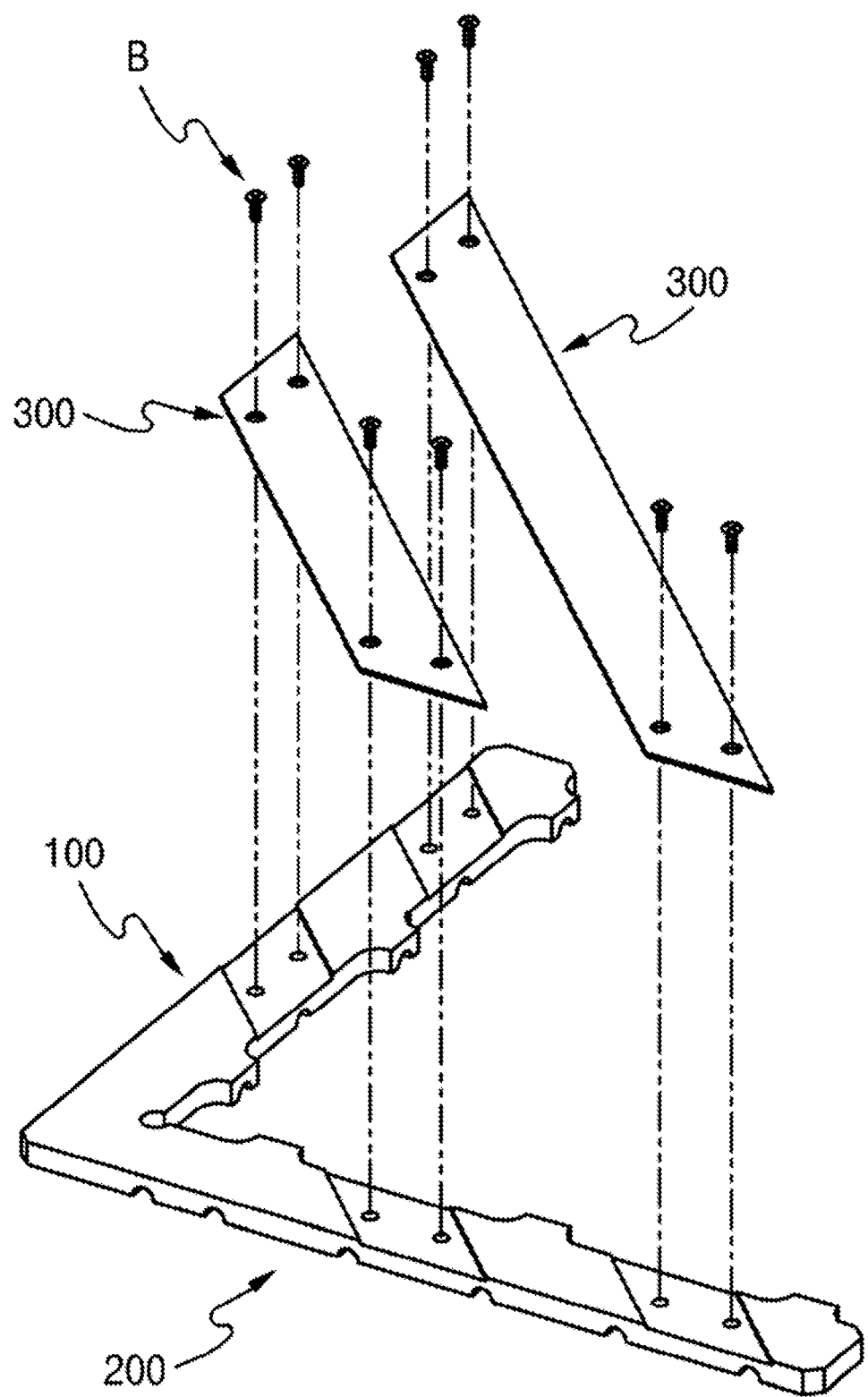
FIG. 3 is an exploded view of the jig illustrated in FIG. 2.

FIG. 2 is a perspective view of the jig 10 illustrated in FIG. 1, and FIG. 3 is an exploded view of the jig 10 illustrated in FIG. 2.

Referring to FIGS. 2 and 3, the jig 10 according to an embodiment may include a first body 100, a second body 200, and a fixer 300. Although separately described due to their positions and functions, the first body 100 and the second body 200 may be connected to each other and constitute a single member. The first body 100 and the second body 200 may be bar type members. The second body 200 may be connected perpendicular to the first body 100. For example, the first body 100 and the second body 200 may be disposed to constitute an "L" shape.

The fixer 300 is a band type member and serves to cover and fix an upper surface of the solar cell module 1. The fixer 300 may be disposed across the first body 100 and the second body 200. For example, any one side end of the fixer 300 may be coupled to the first body 100, and the other side end of the fixer 300 may be coupled to the second body 200. The fixer 300 may be fastened to each of the first body 100 and the second body 200 through a fastening member B. The fixer 300 may be provided as a plurality of fixers 300. Meanwhile, the fixer 300 may be made of a Kevlar material.

A Teflon coating layer may be disposed on a surface of the first body 100 and a surface of the second body 200. For example, a surface of the first body 100 and a surface of the second body 200 may be coated with 80 μm or more of poly fluoro alkoxy (PFA). PFA coating, which is one type of Teflon coating, is coating using fluoroplastic having advantages of both a fluorinated ethylene propylene (FEP) copolymer and poly tetra fluoro ethylene (PTFE) and has advantages that non-stickiness and heat resistance are excellent, chemical resistance and corrosion resistance are excellent, and wear resistance is also high.

After the surface of the first body 100 and the surface of the second body 200 are Teflon-coated as above and the laminating process is completed, the first body 100 and the second body 200 are allowed to easily detach from the encapsulation materials without fusion.

Figure 4:
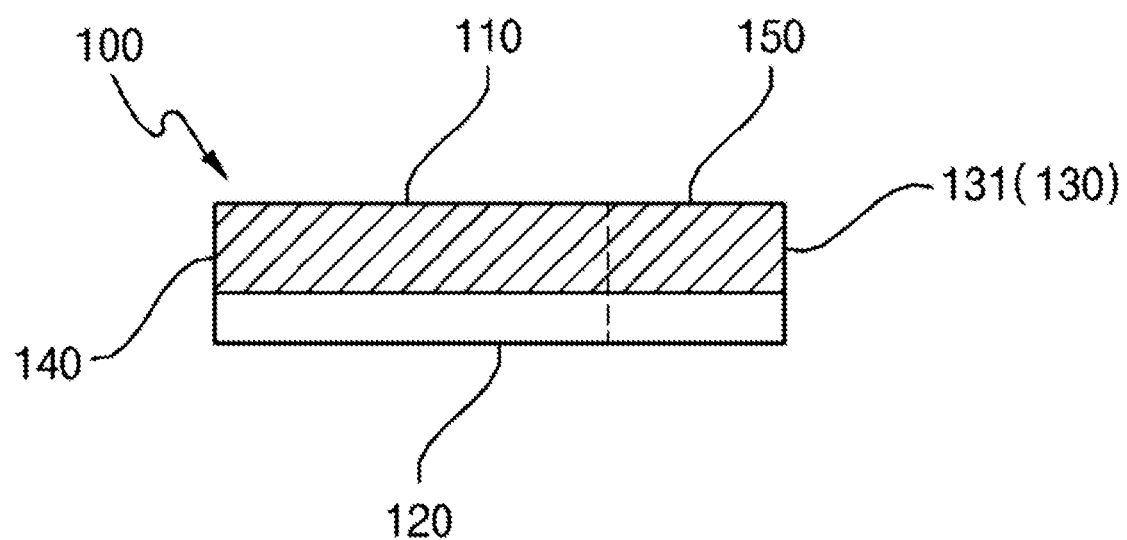
FIG. 4 is a cross-sectional view of a first body taken along line A-A of FIG. 2.

FIG. 4 is a cross-sectional view of the first body 100 taken along line A-A of FIG. 2.

Referring to FIGS. 2 and 4, the first body 100 may be a member having a rectangular cross-section. The first body 100 may include a first upper surface 110, a first lower surface 120, a first side surface 130, and a third side surface 140. A portion of the first side surface 130 is an area that comes in contact with the solar cell module 1. For example, the first body 100 may include a plurality of first protrusions 150 disposed to protrude from the first side surface 130. The first protrusion 150 may include a contact surface 131 configured to come in contact with one side surface of the solar cell module 1 forming a corner, and another area of the first side surface 130 excluding the first protrusion 150 may be disposed to be spaced apart from the solar cell module 1. The third side surface 140 is a surface facing the first side surface 130.

Figure 5:
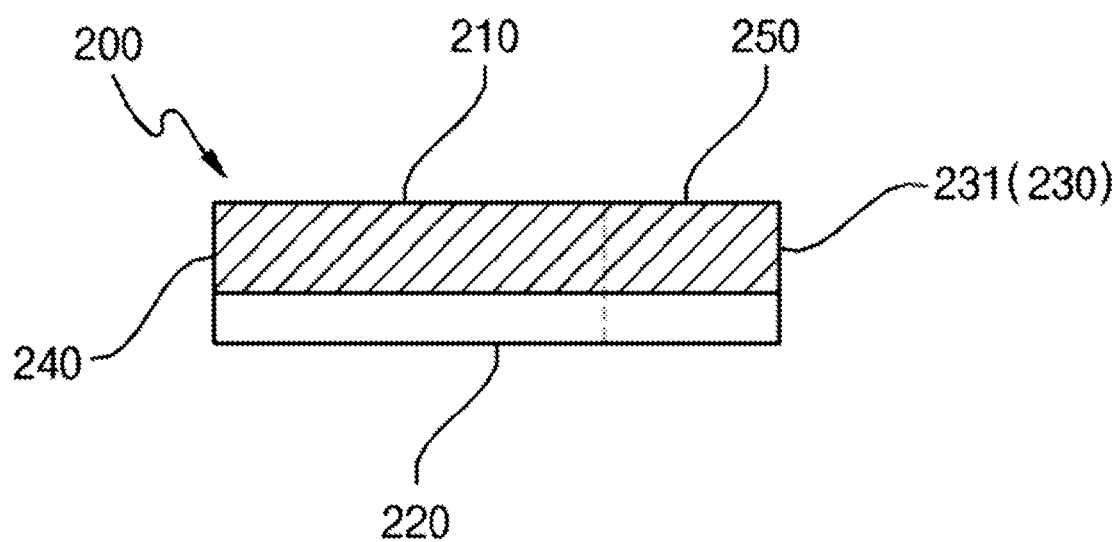
FIG. 5 is a cross-sectional view of a second body taken along line B-B of FIG. 2.

FIG. 5 is a cross-sectional view of the second body 200 taken along line B-B of FIG. 2.

Referring to FIGS. 2 and 5, the second body 200 may also be a member having a rectangular cross-section. The second body 200 may include a second upper surface 210, a second lower surface 220, a second side surface 230, and a fourth side surface 240. A portion of the second side surface 230 is an area that comes in contact with the solar cell module 1. For example, the second body 200 may include a plurality of second protrusions 250 disposed to protrude from the second side surface 230. The second protrusion 250 may include a contact surface 231 configured to come in contact with the other side surface of the solar cell module 1 forming the corner, and another area of the second side surface 230 excluding the second protrusion 250 may be disposed to be spaced apart from the solar cell module 1. The fourth side surface 240 is a surface facing the second side surface 230.

Figure 6:
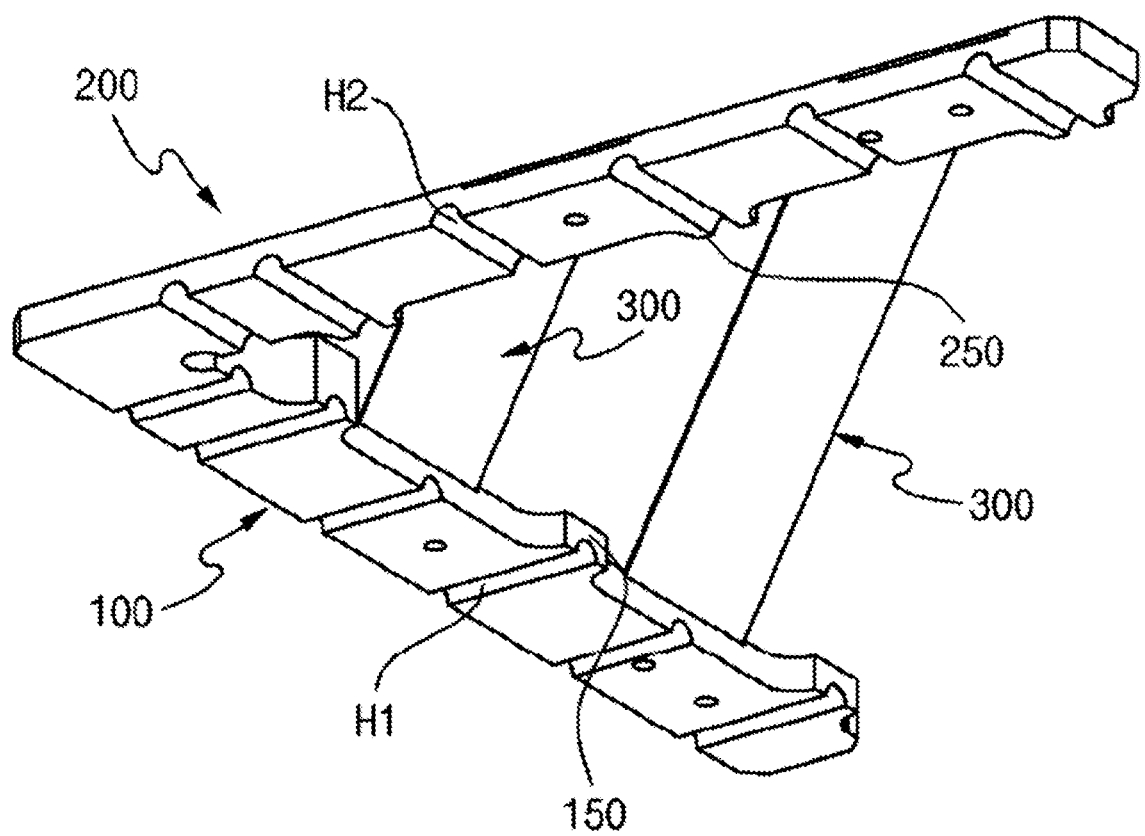
FIG. 6 is a bottom view of the jig illustrated in FIG. 2.

FIG. 6 is a bottom view of the jig 10 illustrated in FIG. 2.

Referring to FIG. 6, the first body 100 may include a plurality of first holes H1 configured to pass through the first side surface 130 and the third side surface 140. The second body 200 may also include a plurality of second holes H2 configured to pass through the second side surface 230 and the fourth side surface 240.

In the laminating process, when the solar cell module 1 is pressed by the diaphragm sheet, air in the encapsulation material should exit the solar cell module 1. The first hole H1 and the second hole H2 serve as release paths for air in the encapsulation material.

The plurality of first holes H1 may be disposed to be spaced apart in the longitudinal direction of the first body 100. Also, the plurality of second holes H2 may be disposed to be spaced apart in the longitudinal direction of the second body 200. Some of the plurality of first holes H1 may be formed to pass through the first protrusion 150 and the third side surface 140. Since the first protrusion 150 comes in contact with the encapsulation material of the solar cell module 1, air in the encapsulation material may be effectively released through the first holes H1 in a state in which the first protrusion 150 is in contact with the solar cell module 1. For the same reason, some of the plurality of second holes H2 may be formed to pass through the second protrusion 250 and the fourth side surface 240.

The first hole H1 may be disposed to be concave in the first lower surface 120 and disposed to pass through the first side surface 130 and the third side surface 140. Also, the second hole H2 may be disposed to be concave in the second lower surface 220 and disposed to pass through the second side surface 230 and the fourth side surface 240.

Figure 7:
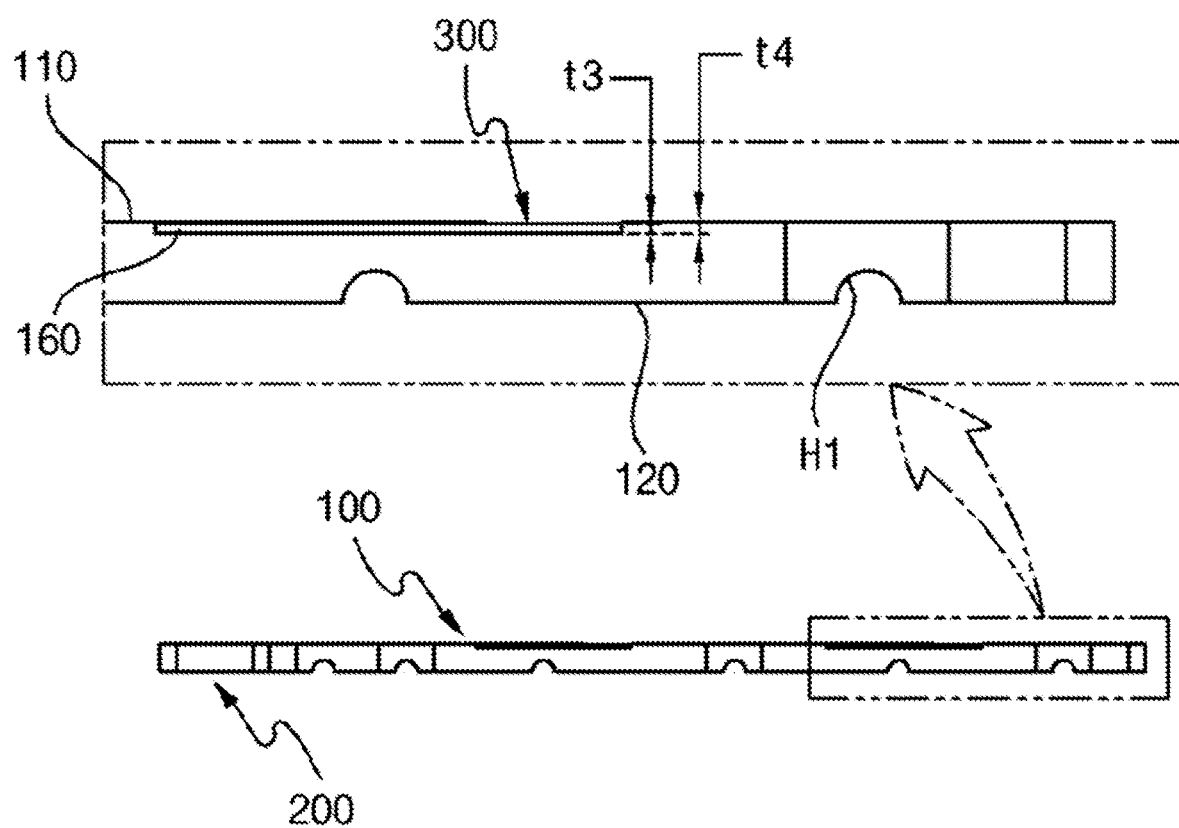
FIG. 7 is an enlarged view of a portion of the jig that illustrates a first groove of the jig.

FIG. 7 is an enlarged view of a portion of the jig 10 that illustrates a first groove of the jig 10.

Referring to FIG. 7, in the first body 100, a first groove 160 is disposed to be concave in the first upper surface 110. Any one side end of the fixer 300 may be seated on the first groove 160 and coupled to the first body 100. A thickness t4 of the first groove 160 may be equal to, or at least greater than, a thickness t3 of the fixer 300. In a case in which the fixer 300 disposed on the first groove 160 protrudes past the first upper surface 110, there is a risk that, as the diaphragm sheet comes in contact with the fixer 300, adhesion between the diaphragm sheet and the solar cell module 1 may be decreased, and the solar cell module 1 may not be sufficiently pressed. In order to prevent such a risk, the thickness t4 of the first groove 160 may be formed to be equal to or less than the thickness t3 of the fixer 300 to induce the diaphragm sheet to come in contact with the first upper surface 110 without being interfered with by the fixer 300.

Figure 8:
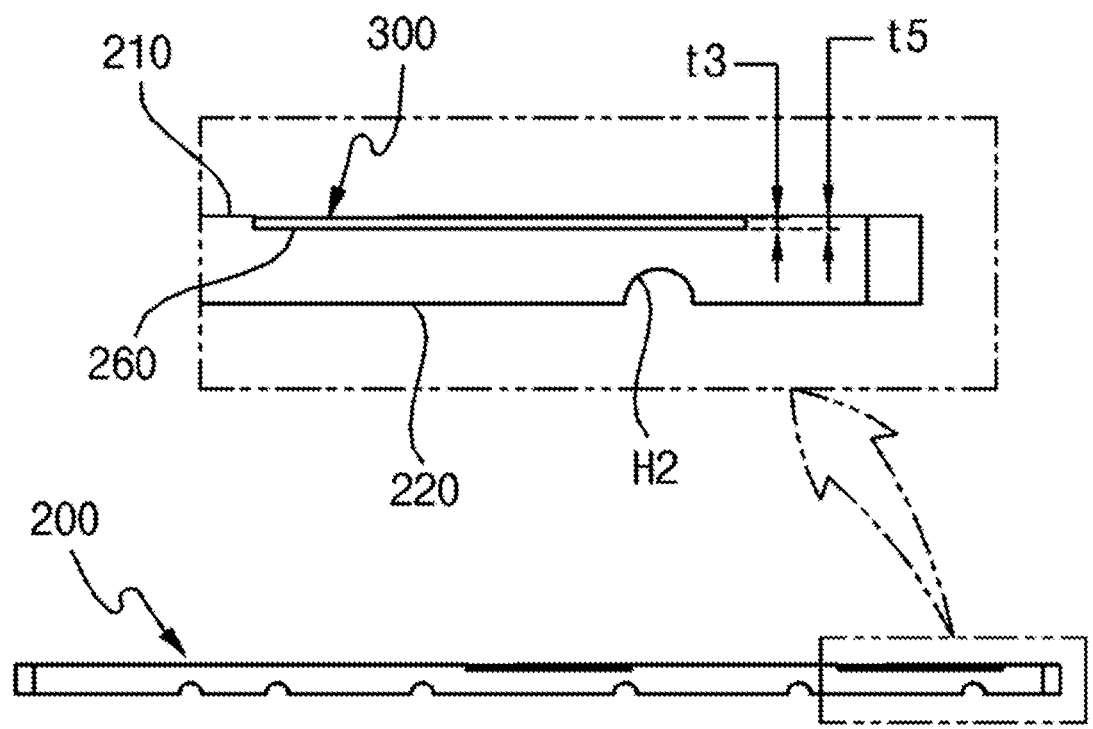
FIG. 8 is an enlarged view of a portion of the jig that illustrates a second groove of the jig.

FIG. 8 is an enlarged view of a portion of the jig 10 that illustrates a second groove of the jig 10.

Referring to FIG. 8, in the second body 200, a second groove 260 is disposed to be concave in the second upper surface 210. The other side end of the fixer 300 may be seated on the second groove 260 and coupled to the second body 200. A thickness t5 of the second groove 260 may be equal to, or at least greater than, the thickness t3 of the fixer 300. In a case in which the fixer 300 disposed on the second groove 260 protrudes past the second upper surface 210, there is a risk that the solar cell module 1 may not be sufficiently pressed. In order to prevent such a risk, the thickness t5 of the second groove 260 may be formed to be equal to or less than the thickness t3 of the fixer 300 to induce the diaphragm sheet to come in contact with the second upper surface 210 without being interfered with by the fixer 300.

Figure 9:
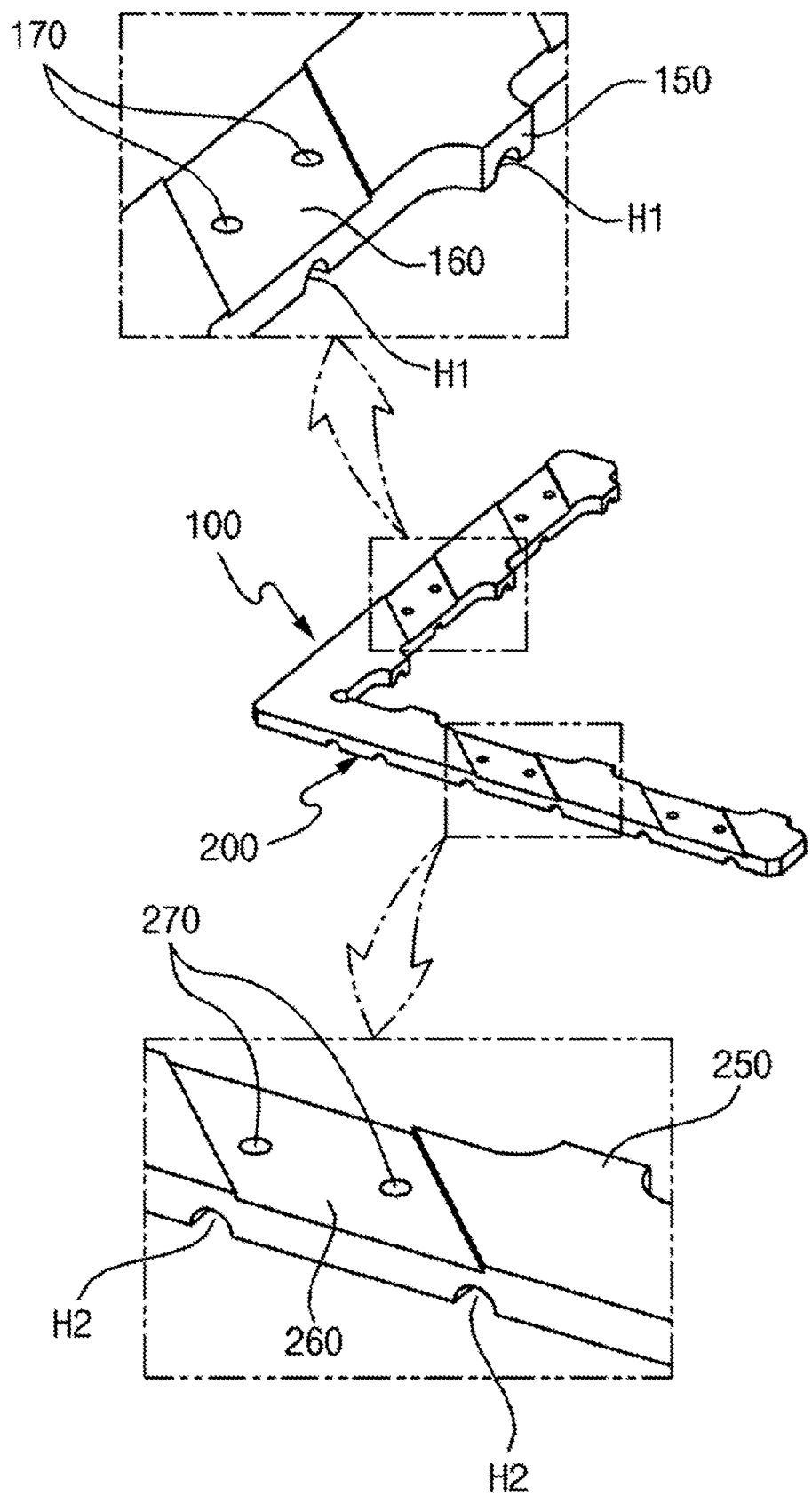
FIG. 9 is an enlarged view of the first groove and the second groove.

FIG. 9 is an enlarged view of the first groove 160 and the second groove 260.

Referring to FIGS. 8 and 9, a plurality of first grooves 160 may be disposed between one first protrusion 150 and another first protrusion 150 that neighbor each other in the longitudinal direction of the first body 100. Also, a plurality of second grooves 260 may be disposed between one second protrusion 250 and another second protrusion 250 that neighbor each other in the longitudinal direction of the second body 200. Accordingly, any one side end of the plurality of fixers 300 may be disposed between the first protrusions 150 neighboring each other, and the other side end of the fixers 300 may be disposed between the second protrusions 250 neighboring each other.

A first fastening hole 170 may be disposed in the first hole H1. A fastening member B for coupling with the fixer 300 is fastened to the first hole H1. Also, a second fastening hole 270 may be disposed in the second hole H2. The fastening member B for coupling with the fixer 300 is fastened to the second hole H2.

Figure 10:
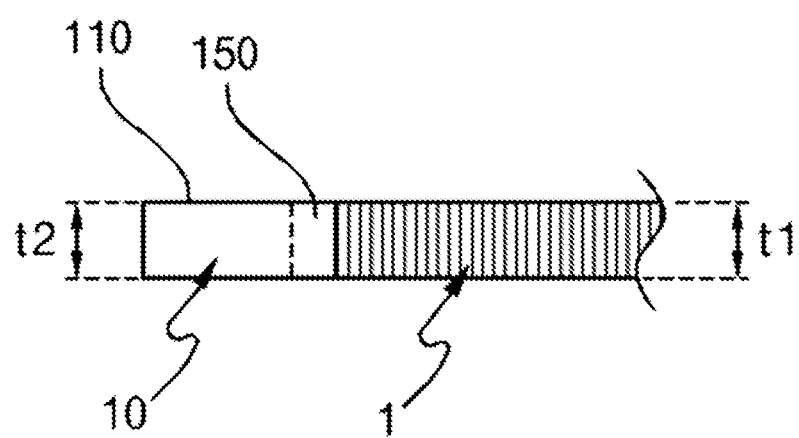
FIG. 10 is a view illustrating a side surface of the first body that comes in contact with the solar cell module.

FIG. 10 is a view illustrating a side surface of the first body 100 that comes in contact with the solar cell module 1.

Referring to FIG. 10, a thickness t2 of the first body 100 may be equal to a thickness t1 of the solar cell module 1. Also, the first upper surface 110 of the first body 100 may be disposed to be coplanar with an upper surface of the solar cell module 1. Although not illustrated in the drawing, a thickness of the second body 200 may also be equal to the thickness t1 of the solar cell module 1, and the second upper surface 210 of the second body 200 may be disposed to be coplanar with the upper surface of the solar cell module 1.

This is to guide a pressing force of the diaphragm acting on the corners of the solar cell module 1 toward the first body 100 or the second body 200. When the first upper surface 110 of the first body 100 or the second upper surface 210 of the second body 200 is lower than the upper surface of the solar cell module 1, there is a risk that the solar cell module 1 may be damaged due to the pressing force of the diaphragm being directly applied to the solar cell module 1 during the laminating process. Also, when the first upper surface 110 of the first body 100 or the second upper surface 210 of the second body 200 protrudes past the upper surface of the solar cell module 1, a problem may occur in which the pressing force of the diaphragm is not sufficiently applied to the solar cell module 1 during the laminating process. Therefore, the first upper surface 110 of the first body 100 or the second upper surface 210 of the second body 200 may be positioned to be coplanar with the upper surface of the solar cell module 1.

Figure 11:
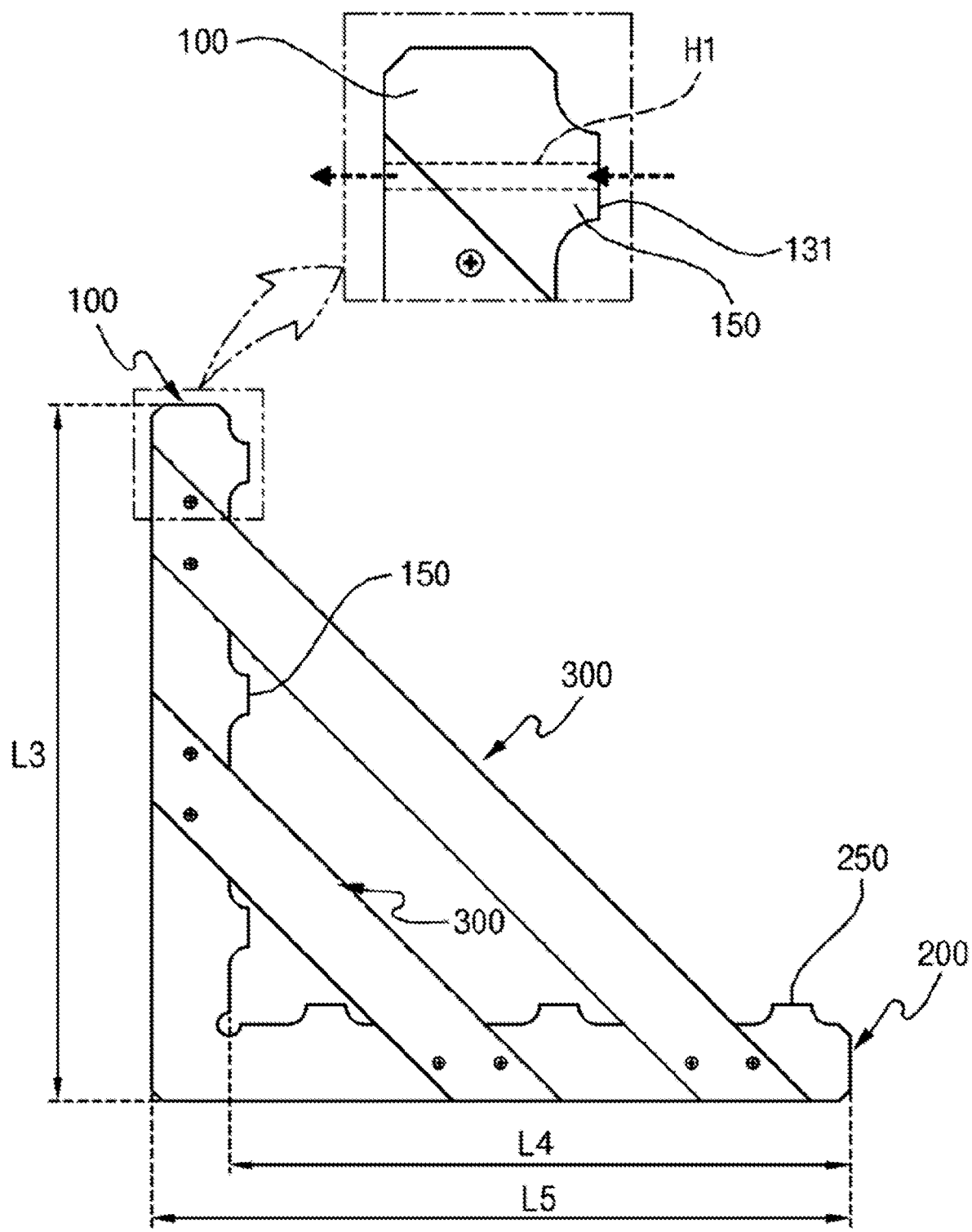
FIG. 11 is a plan view of the jig illustrated in FIG. 2.

FIG. 11 is a plan view of the jig 10 illustrated in FIG. 2.

Referring to FIGS. 6 and 11, the first hole H1 may be disposed in the first protrusion 150. Since the first protrusion 150 comes in contact with the solar cell module 1, air in the encapsulation material may be released to the outside of the jig 10 through the first hole H1. Air in the encapsulation material may be released to the outside of the jig 10 also through the second hole H2 disposed in the second protrusion 250.

A length L3 of the first body 100 may be different from a length L4 of the second body 200. However, in the longitudinal direction of the second body 200, a length L5 of the jig 10 may be equal to the length L3 of the first body 100. Referring to FIGS. 1 and 11, the length L3 of the first body 100 and the length L4 of the second body 200 are less than ½ of a length L1 of one side surface and a length L2 of the other side surface forming a corner of the solar cell module 1. Since the jig 10 according to an embodiment surrounds only the corner portions of the solar cell module 1 without surrounding the entire solar cell module 1, it is easy to mount or remove the jig 10 on or from the solar cell module 1, and thus the number of workers can be reduced, and the process can be simplified.

Figure 12:
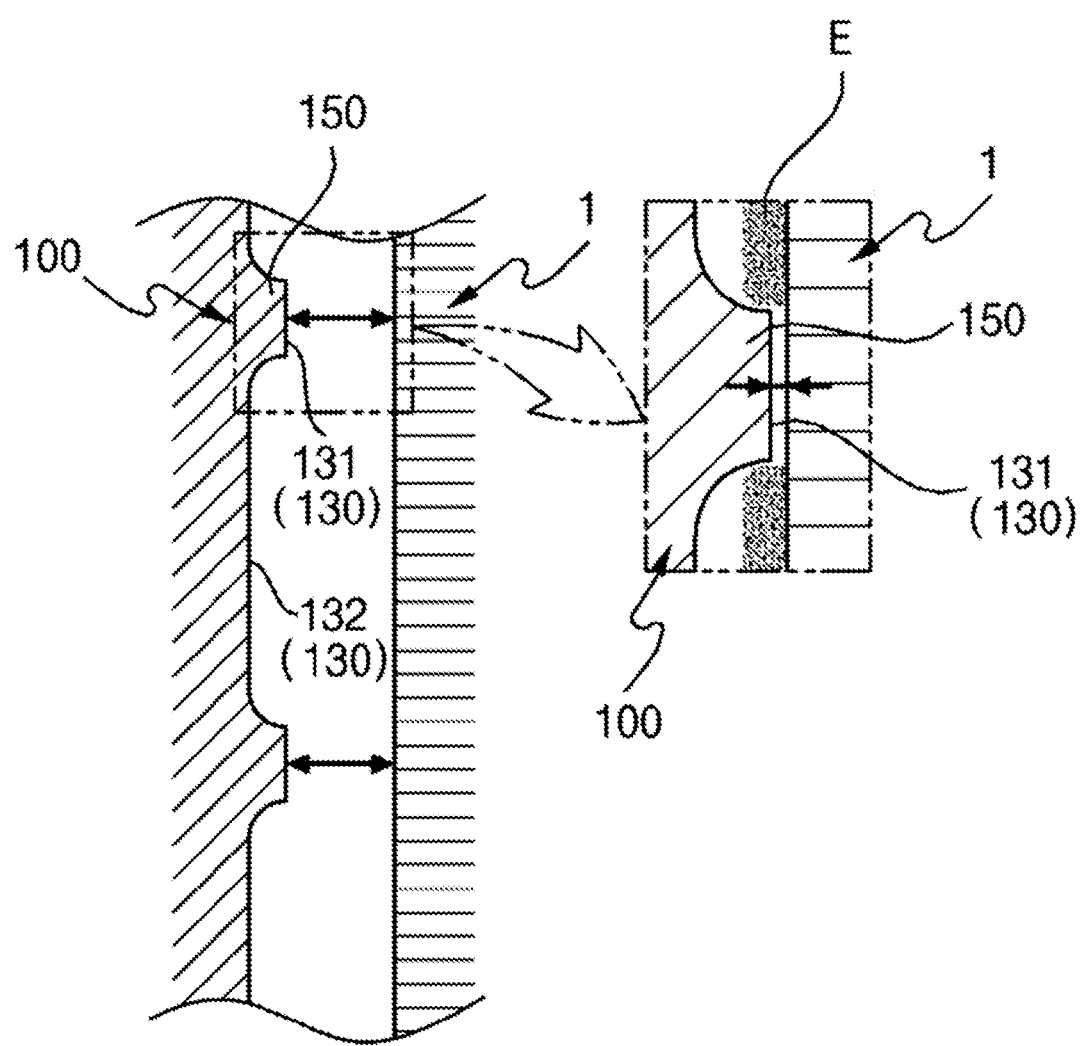
FIG. 12 is an enlarged view of a contact portion between the jig and the solar cell module.

FIG. 12 is an enlarged view of a contact portion between the jig 10 and the solar cell module 1.

Referring to FIG. 12, the contact surface 131 of the first protrusion 150 of the jig 10 comes in contact with a portion adjacent to a corner of the solar cell module 1. Although not illustrated in the drawings, the second protrusion 250 of the jig 10 also comes in contact with a portion adjacent to a corner of the solar cell module 1. After the laminating process, an excess E of the encapsulation material leaks to an outside of an edge of the solar cell module 1. The leaked excess E of the encapsulation material interferes with removal of the jig 10 after the laminating process is completed. Since, in the jig 10 according to an embodiment, the first protrusion 150 or the second protrusion 250 comes in contact with the solar cell module 1, and an area 132 of the first side surface 130 that excludes the first protrusion 150 is disposed to be spaced apart from the solar cell module 1, the removal of the jig 10 from the solar cell module 1 is not interfered with by the excess E of the encapsulation material. The same applies for the second protrusion 250. In this way, by the first protrusion 150 and the second protrusion 250, the jig 10 according to an embodiment reduces an area coming in contact with the solar cell module 1 and thus has an advantage that the removal of the jig 10 after the laminating process is completed is facilitated.

Figure 13:
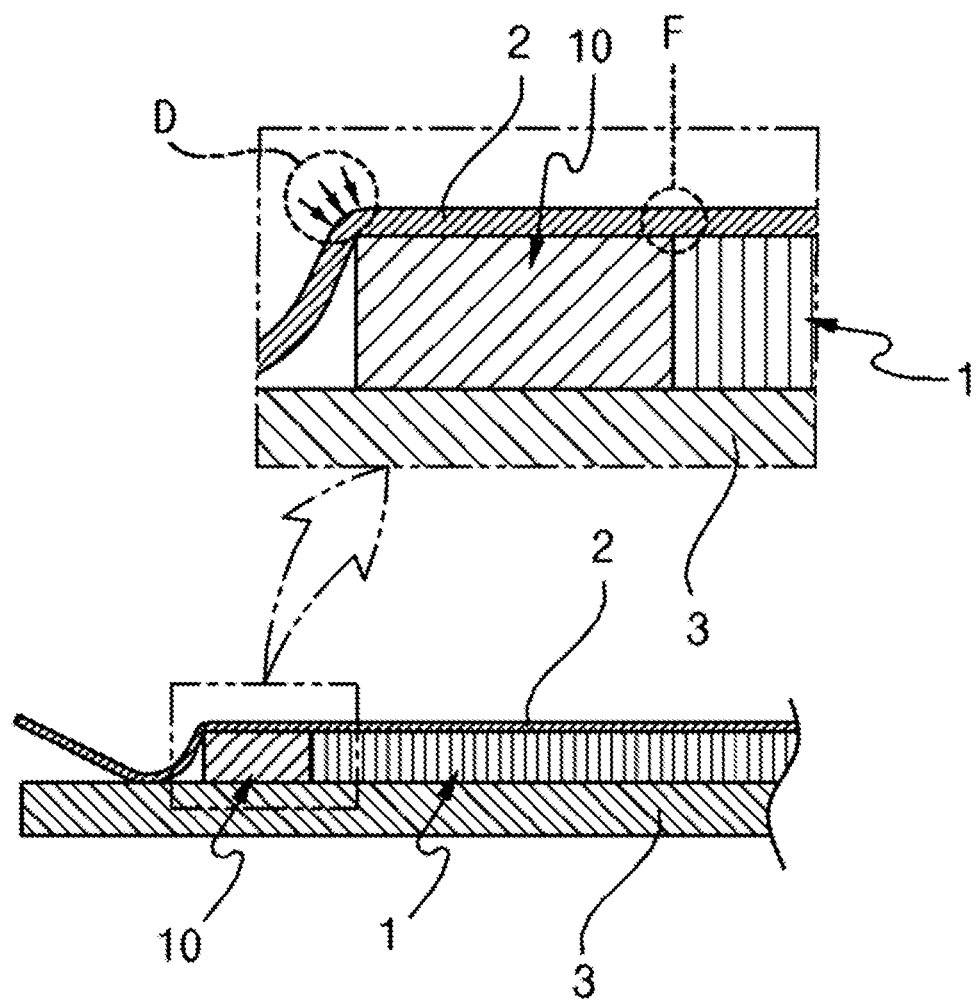
FIG. 13 is a view illustrating a state in which the jig and the solar cell module are pressed by a diaphragm sheet during a laminating process.

FIG. 13 is a view illustrating a state in which the jig 10 and the solar cell module 1 are pressed by the diaphragm sheet during the laminating process.

Referring to FIG. 13, when the laminating process is performed, in a state in which the solar cell module 1 is placed on a base 3, a diaphragm sheet 2 moves downward and presses the solar cell module 1 in a vacuum state. Here, since a portion F adjacent to a corner of the solar cell module 1 is protected by the jig 10, at the portion F adjacent to the corner of the solar cell module 1, a pressing force of the diaphragm sheet 2 is guided toward a portion D adjacent to a corner of the jig 10, and the corner of the solar battery is protected.

Figure 14:
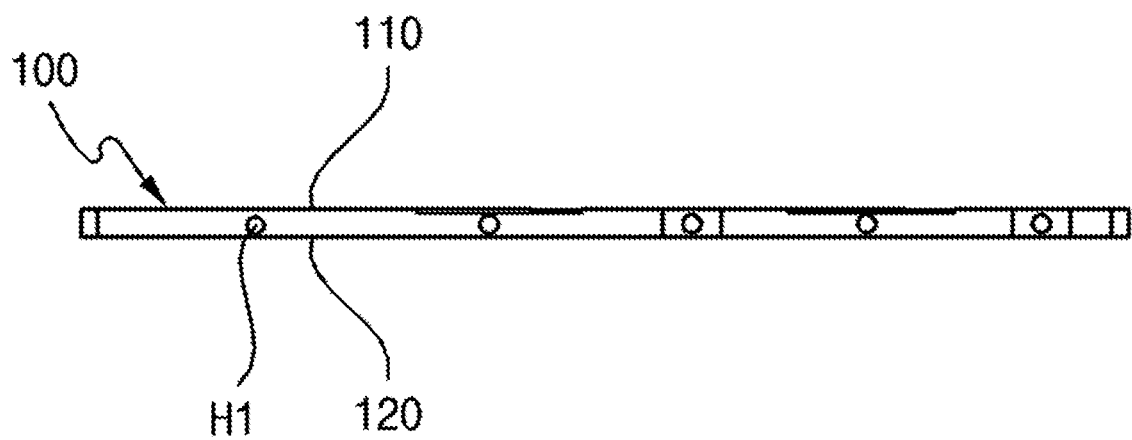
FIG. 14 is a view illustrating a first body having a first hole formed therein according to a modified example.

FIG. 14 is a view illustrating a first body 100 having a first hole H1 formed therein according to a modified example.

Referring to FIG. 14, the first hole H1 may, while passing through the first side surface 130 and the third side surface 140 of the first body 100, not be formed in the first lower surface 120 and may be disposed between the first upper surface 110 and the first lower surface 120, that is, inside the first body 100. Although not illustrated, the second hole H2 may also pass through the second side surface 230 and the fourth side surface 240 of the second body 200 and be disposed inside the second body 200.

A jig for laminating a solar cell module according to one exemplary embodiment of the present disclosure has been described in detail above with reference to the accompanying drawings.

The above-described embodiment of the present disclosure should be understood as being illustrative, instead of limiting, in all aspects, and the scope of the present disclosure is defined by the claims below rather than by the detailed description given above. Also, the meaning and scope of the claims and all changes or modifications derived from their equivalents should be construed as falling within the scope of the present disclosure.

INDUSTRIAL APPLICABILITY

The present disclosure may be used in the field of manufacturing a solar cell module.

The invention claimed is:

1. A jig for laminating a solar cell module, the jig comprising:
 a first body including a first upper surface and a first side surface adjacent to the first upper surface and having at least a partial area configured to come in contact with one side surface forming a corner of the solar cell module;
 a second body including a second upper surface and a second side surface adjacent to the second upper surface and having at least a partial area configured to come in contact with another side surface forming the corner; and
 a fixer disposed in a first groove of the first upper surface and a second groove of the second upper surface and disposed across the first body and the second body to fix the solar cell module,
 wherein the first side surface includes a plurality of first protrusions each protruding toward said one side surface of the solar cell module and having a first contact surface that contacts said one side surface, the plurality of first protrusions being disposed to be spaced apart in a longitudinal direction of the first body; and wherein the second side surface includes a plurality of second protrusions each protruding toward said another side surface of the solar cell module and having a second contact surface that contacts said another side surface, the plurality of second protrusions being disposed to be spaced apart in a longitudinal direction of the second body; and wherein a length of the first body and a length of the second body are less than ½ of a length of the solar cell module.

2. The jig of claim 1, wherein the second body is connected perpendicular to the first body.

3. The jig of claim 1, wherein the first body includes a first hole configured to communicate with the first side surface to form a path through which air in an encapsulation material of the solar cell module is released to an outside during a laminating process.

4. The jig of claim 3, wherein the first body includes a first lower surface and a third side surface adjacent to the first lower surface, and the first hole is disposed to be concave in the first lower surface and disposed to pass through the first side surface and the third side surface.

5. The jig of claim 1, wherein the second body includes a second hole configured to communicate with the second side surface to form a path through which air in an encapsulation material of the solar cell module is released to an outside during a laminating process.

6. The jig of claim 5, wherein the second body includes a second lower surface and a fourth side surface adjacent to the second lower surface, and the second hole is disposed to be concave in the second surface and disposed to pass through the second side surface and the fourth side surface.

7. The jig of claim 1, wherein the fixer is disposed between the first protrusions neighboring each other in the longitudinal direction of the first body and is disposed between the second protrusions neighboring each other in the longitudinal direction of the second body.

8. The jig of claim 1, wherein:
the first groove is disposed between the first protrusions neighboring each other in the longitudinal direction of the first body; and
the second groove is disposed between the second protrusions neighboring each other in the longitudinal direction of the second body.

9. The jig of claim 1, wherein:
the first upper surface and the second upper surface are positioned to be coplanar; and
a thickness of the fixer is less than a thickness of the first groove and a thickness of the second groove.

10. The jig of claim 1, wherein a surface of the first body and a surface of the second body include a Teflon coating layer.

* * * * *